United States Patent [19]

Swonger

[11] Patent Number: 5,663,860
[45] Date of Patent: Sep. 2, 1997

[54] HIGH VOLTAGE PROTECTION CIRCUITS

[75] Inventor: James W. Swonger, Palm Bay, Fla.

[73] Assignee: Harris Corporation, Palm Bay, Fla.

[21] Appl. No.: 673,396

[22] Filed: Jun. 28, 1996

[51] Int. Cl.$^6$ ............................................. H02H 9/00
[52] U.S. Cl. ...................... 361/56; 361/111; 257/173
[58] Field of Search .................... 361/56, 111, 91; 257/154, 173

[56] References Cited

U.S. PATENT DOCUMENTS

| | | |
|---|---|---|
| 4,100,561 | 7/1978 | Ollendorf . |
| 4,131,928 | 12/1978 | Davis et al. . |
| 4,143,391 | 3/1979 | Suzuki et al. . |
| 4,400,711 | 8/1983 | Avery . |
| 4,484,244 | 11/1984 | Avery . |
| 4,543,593 | 9/1985 | Fujita . |
| 4,567,500 | 1/1986 | Avery . |
| 4,595,941 | 6/1986 | Avery . |
| 4,631,567 | 12/1986 | Kokado et al. . |
| 4,757,363 | 7/1988 | Bohm et al. . |
| 4,760,433 | 7/1988 | Young et al. . |
| 4,811,155 | 3/1989 | Kuriyama et al. . |
| 4,870,530 | 9/1989 | Hurst et al. . |
| 4,875,130 | 10/1989 | Huard . |
| 4,891,729 | 1/1990 | Sugiyama et al. . |
| 4,918,563 | 4/1990 | Kanai et al. . |
| 4,939,616 | 7/1990 | Rountree . |
| 5,012,317 | 4/1991 | Rountre ........................ 257/173 |
| 5,043,782 | 8/1991 | Avery . |
| 5,072,273 | 12/1991 | Avery . |
| 5,138,413 | 8/1992 | Grosset et al. . |
| 5,214,562 | 5/1993 | Levi . |
| 5,289,334 | 2/1994 | Ker et al. ........................ 361/56 |
| 5,452,171 | 9/1995 | Metz et al. ........................ 361/56 |
| 5,500,546 | 3/1996 | Marum et al. ........................ 257/358 |

OTHER PUBLICATIONS

Mack, W. D., et al. "Protecting BiCMOS Circuits: ESD protecting RF designs fabricated on modern BiCMOSprocesses requires new protection networks," Reprint from, Proceedings of 1992 IEEE International Symposium on Circuits and Systems. San Diego, California. May 13, 1992.

Chatterjee, A., et al. "A Low–Voltage Triggering SCR for On–Chip ESD Protection at Output and Input Pads," *IEEE Electron Device Letters*. vol. 12, No. 1, Jan. 1991.

Primary Examiner—Jeffrey A. Gaffin
Assistant Examiner—Michael J. Sherry
Attorney, Agent, or Firm—Jaeckle Fleischmann & Mugel, LLP

[57] ABSTRACT

Integrated circuits are provided for protecting a device from high voltage signals, such as caused by ESD, at an external pin (12) of a device on an integrated circuit. A first circuit has a voltage reference terminal (24), and a pin resistor (13) connected in series with the pin (12) and an input terminal (14) to a functional circuit. An SCR (30) has an anode, cathode, anode-gate, and cathode-gate terminals. The anode of the SCR (30) is connected to the input terminal, while the cathode of the SCR is connected to the voltage reference terminal (24). A shunt resistor (19) connects across the anode and anode-gate of the SCR (30), and an another shunt resistor (20) connects across the cathode and cathode-gate of the SCR. A zener diode (22) is provided for setting a breakdown voltage of the SCR (30) between its anode-gate and cathode-gate. This integrated circuit protects a device against high voltages having a positive polarity, and also protects the device from ESD voltages having a negative polarity by switching the anode connections with the cathode connections. In operation, the SCR (30) triggers in response to a voltage at the pin (12) above the zener's breakdown voltage, and the SCR automatically turns off when the voltage across the pin resistor (13) has returned to within a hold voltage level that may be near or within the operational range of signals at the pin. The relative size of the first resistor (13) and the one of shunt resistors (19 or 20) having the lowest resistance controls the holding current of the SCR at either the anode-gate or cathode-gate of the SCR (30). Another integrated circuit provides for protecting a device from high voltage signals having either a positive or negative polarity using two SCRs (28a, 28b).

21 Claims, 5 Drawing Sheets

HIGH VOLTAGE PROTECTION CIRCUITS

FIELD OF THE INVENTION

The present invention relates to high voltage protection circuits, and more particularly to circuits for protecting the analog inputs and outputs of integrated circuit devices from high voltages, such as caused by Electrostatic Discharge (ESD).

BACKGROUND OF THE INVENTION

Integrated circuit (IC) devices may be provided with high voltage protection circuits to protect the devices from the high voltages caused by electrostatic charges, which may be potentially damaging. These high voltage protection circuits have utilized SCRs that generally trigger in response to high voltages at the ICs I/O pads or pins to provide a path for dissipating the voltage away from the device being protected. Examples of the use of SCRs in protection circuits are shown in U.S. Pat. Nos. 5,567,500, 4,072,273, and 4,870,530.

One problem of these SCR-based protection circuits is that after a high ESD voltage triggers the SCR to turn on, it is difficult to turn it off again (i.e., unlatch) because very low currents (for example, <10 mA) at the gates of the SCR will usually keep the SCR on. The standard solutions to this problem are to either completely remove the input signal or to remove the power to the device being protected. Both of these solutions are impractical in operating systems. This is especially a problem in situations where the circuits are used is very remote systems, such as an orbiting satellite. Therefore, it is desirable to automatically turn off the SCR once the high voltage ESD pulse has been removed and the voltage at the pin connected to the protection circuit has returned to a normal operating voltage range.

Another problem with SCR-based protection circuits is that they generally do not provide ESD protection when the IC device it is protecting is not powered up. It is thus further desirable to provide a protection circuit that will not only protect an IC device when the device is powered but also when the IC device is not powered.

SUMMARY OF THE INVENTION

Accordingly, an object of the present invention is to provide improved high voltage protection circuits in which after a high voltage, such as caused by ESD, has triggered an SCR to turn on, the SCR automatically turns off when the high voltage is no longer present and voltages have returned to within a normal range of operation.

Another object of the present invention is to provide improved high voltage protection circuits that protect an IC device when the device is both unpowered and powered.

A further object of the present invention is to provide improved high voltage protection circuits having a resistor in series with an SCR in which the resistor dissipates most of the power of an ESD voltage received by the circuits.

The invention controls the holding current in the SCR of a high voltage protection circuit. The holding current is the minimum current between the anode and the anode-gate of the SCR sufficient to maintain the latched state of the SCR after it has triggered. In prior art devices, both the anode and anode-gate are at the same potential, such that when the SCR is triggered even a small amount of current is enough to maintain the SCR in a latched state. The present invention controls this holding current by using a first relatively large resistor in series with an input/output pin and the anode of the SCR, and a second smaller resistor connected between the first resistor and the anode-gate. The smaller second resistor controls the holding current into the anode-gate of the SCR. When the voltage drop across the second resistor falls below the $V_{BE}$ representing the anode/anode-gate junction of the triggered SCR, it unlatches and turns off because the holding current cannot be maintained to the anode-gate. Alternatively, the holding current may be controlled to the cathode-gate of the SCR, rather than the anode-gate, to maintain the SCR in a latched state after it is triggered, by connecting the second resistor across the cathode-gate and cathode of the SCR.

Briefly described, the present invention provides an integrated circuit with a functional circuit and a protection circuit for protecting the functional circuit from high voltage signals, such as caused by ESD. The protection circuit is disposed between an external input/output pin and the functional circuit. The functional circuit may be any circuit integrated on a semiconductor substrate including, but not limited to, an amplifier, an analog-to-digital converter, a microprocessor, a digital signal processor, etc. The protection circuit has a voltage reference terminal, such as a ground terminal, and a first resistor ($R_{PIN}$) connected in series with the pin and the functional circuit. The protection circuit has an SCR with an anode, cathode, anode-gate and cathode-gate terminals. The anode terminal of the SCR is connected to the functional circuit, while the cathode terminal is connected to the voltage reference terminal. A shunt resistor ($Rs_1$) connects across the anode and anode-gate terminals of the SCR. The SCR in the protection circuit has a holding current set by the relative resistance values of the first resistor and $Rs_1$. The protection circuit may further have another shunt resistor ($Rs_2$) connected across the cathode and cathode-gate terminals of the SCR, and a mechanism for setting a breakdown voltage of the SCR between its anode-gate and cathode-gate terminals. Preferably, this mechanism is a zener diode having its anode connected to the anode-gate terminal of the SCR and its cathode connected to the cathode-gate terminal of the SCR.

The protection circuit protects the functional circuit from ESD voltages having a positive polarity, but may operate to protect the device from ESD voltages having a negative polarity by switching in the above circuit the connections of the anode and cathode terminals of the SCR.

The resistance value of the resistors $R_{PIN}$, $Rs_1$, and $Rs_2$ and the breakdown voltage in the above circuit are set so that after the SCR is triggered by a voltage at the pin at or exceeding the breakdown voltage, the SCR will unlatch when the voltage across $R_{PIN}$ decreases below a hold voltage level. The hold voltage level is herein defined as the voltage across $R_{PIN}$ after the SCR is triggered resulting in a voltage across $Rs_1$ (or $Rs_2$ if the protection circuit controls SCR holding current at the cathode-gate) which produces a current to the anode-gate (or cathode-gate) of the SCR at the holding current level of the SCR at the gate. The holding current represents the current to the respective gate above which the SCR maintains its latched state and below which causes the SCR to unlatch and turn off.

Further, the present invention provides a second protection circuit that provides bi-polarity protection of the functional circuit from high voltage signals at the external pin. The second protection circuit has a voltage reference terminal, such as a ground terminal, and a first resistor connected in series with the pin and the functional circuit. First and second SCRs are provided. Each of these SCRs has anode, cathode, anode-gate and cathode-gate terminals. The anode terminal of the first SCR is connected to the functional circuit, while the cathode terminal of the first SCR is connected to the cathode terminal of the second SCR, and the anode terminal of said second SCR is connected to the voltage reference terminal. Second and third shunt resistors ($Rs_3$ and $Rs_5$) are connected across the anode terminal and the anode-gate terminal of the first and second SCRs, respectively. Fourth and fifth shunt resistors ($Rs_4$ and $Rs_6$) are connected across the cathode terminal and the cathode-gate terminal of the first and second SCRs, respectively. A mechanism is provided for setting a breakdown voltage between the anode-gate and cathode-gate terminals for each of the first and second SCRs.

The above second circuit may further comprise a bypass diode across the anode and cathode terminals of the second SCR and another bypass diode across the anode and cathode terminals of the first SCR. The above shunt resistors in the first and second circuits may represent all, or in part, by internal resistances of their associated SCR gates.

BRIEF DESCRIPTION OF THE DRAWINGS

The present invention will be better understood and appreciated more fully from the following detailed description, taken in conjunction with the accompanying drawings, in which.

DETAILED DESCRIPTION OF THE INVENTION

Figure 1A:
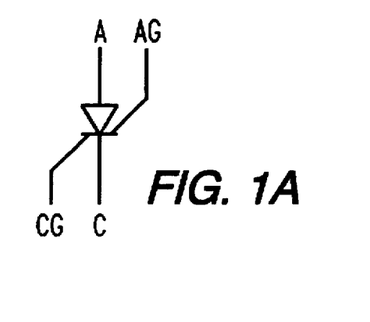
FIG. 1A is the schematic symbol of an SCR.
Figure 1B:
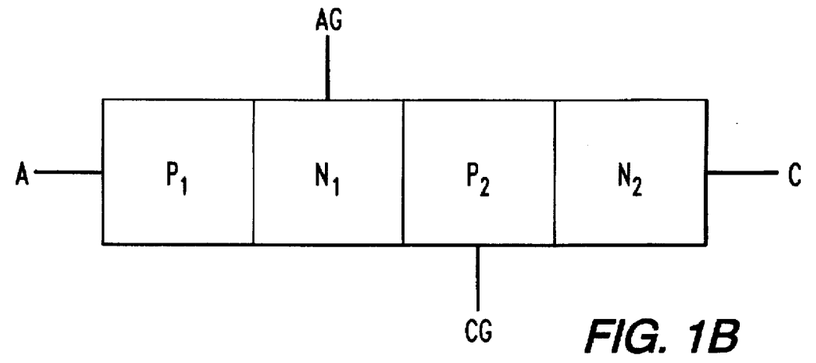
FIG. 1B is block diagram of the internal structure of an SCR comprising P and N semiconductor materials.
Figures 1C, 2:
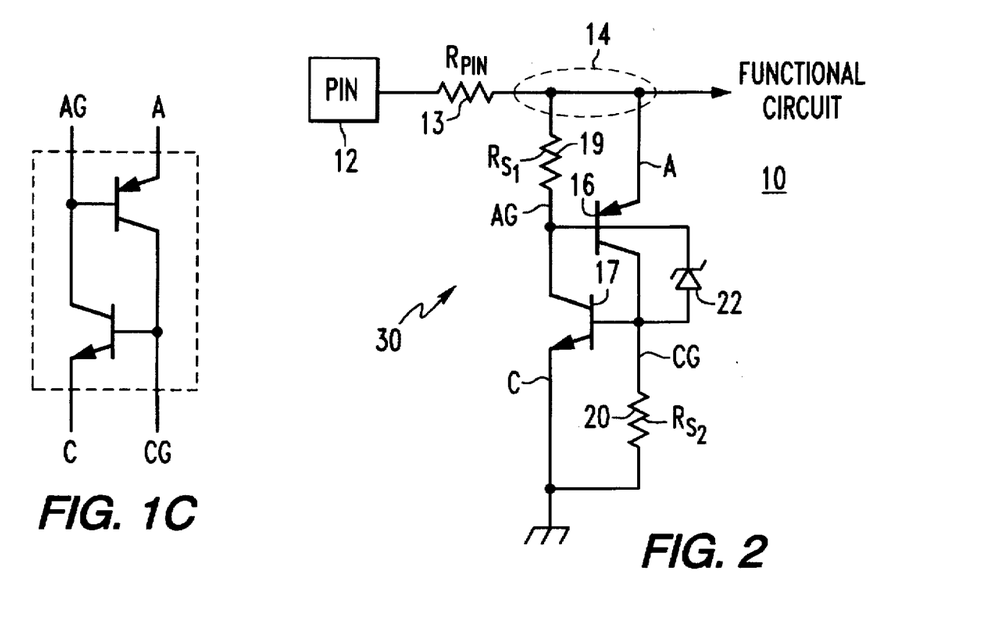
FIG. 1C is a schematic diagram of an SCR formed by PNP and NPN transistors.
FIG. 2 is a partial schematic diagram of an integrated circuit with a protection circuit embodying the present invention for protecting a functional circuit from positive polarity high voltages.

Referring to FIGS. 1A, 1B and 1C, three representations of an SCR are shown.

FIG. 1A is a schematic symbol of an SCR, while FIG. 1B is a block diagram of the typical structure of an SCR having alternating regions of P-type material ($P_1$ and $P_2$) and N-type material ($N_1$ and $N_2$). Further, FIG. 1C is a schematic diagram of an SCR formed by interconnecting a NPN transistor and a PNP transistor. In each figure, the SCR has anode (A), cathode (C), anode-gate (AG), and cathode-gate (CG) terminals. The SCRs in the circuits described hereinafter may embody the SCR structures shown in FIGS. 1B and 1C, but other types of structures providing an SCR may also be used. Accordingly, any representation of a particular SCR structure in the herein circuits is only illustrative.

Referring to FIG. 2, a schematic diagram of a circuit 10 of the present invention is shown for protecting a functional circuit from high voltages, such as caused by Electrostatic Discharge (ESD). A pin 12 represents a connection to an external input/output pin (not shown) of an integrated circuit package, such as at a pad of the circuit, for the input or output of analog signals to the functional circuit. A pin resistor 13 ($R_{PIN}$) is connected in series between pin 12 and an input terminal 14 of the functional circuit. Terminal 14 may also be an output terminal of the functional circuit if pin 12 is an output pin. The functional circuit requires circuit 10 to prevent possible damage by high voltages at pin 12. Such high voltages may not only represent those caused by ESD, but may represent any voltage that is outside the range of operating voltages at pin 12 where protection of the functional circuit is desired. The functional circuit can be located in the same integrated circuit package as circuit 10 or in a separate structure.

Circuit 10 has an SCR 30 formed by a PNP transistor 16 and a NPN transistor 17. SCR 30 has an anode (A), a cathode (C), an anode-gate (AG), and a cathode-gate (CG), and terminals connected thereto, as similarly shown in FIG. 1C. The anode terminal of the SCR is connected to $R_{PIN}$ and input terminal 14, while the cathode terminal of the SCR is connected to a ground voltage reference terminal 24 that is at or near ground for circuit 10, as well as for the functional circuit. Voltage reference terminal 24 may more generally represent any voltage line through which discharging of high voltages appearing at pin 12 is desired, e.g., a voltage supply rail. A shunt resistor 19 ($Rs_1$, is connected across at one end to the anode-gate terminals of the SCR 30, and at the other end to $R_{PIN}$ and the anode. A second shunt resistor 20 ($Rs_2$) is connected at one end to the ground terminal 24 and the cathode, and at the other end to the cathode-gate terminal of SCR 30. SCR 30 also has a zener diode 22 having an anode end connected to the anode-gate terminal of the SCR, and a cathode end connected to the cathode-gate terminal of the SCR. Zener diode 22 provides a breakdown voltage (Vz) across these two terminals.

In FIG. 2, SCR 30 is oriented to protect against high positive polarity voltages appearing at pin 12. However, the functional circuit can be protected against high negative polarity voltages by flipping the SCR, i.e., switching connections of the anode terminal with that of the cathode terminal, and the connections of the anode-gate terminal with that of the cathode-gate terminal. A circuit for protecting against both high negative and positive polarity voltages (i.e., bi-polarity voltage protection) will be discussed later in connection with FIG. 4.

The values of the resistors 13, 19 and 20, and the value of the breakdown voltage Vz, depend upon the desired level of high voltage protection and upon the predetermined range of operation of signals at pin 12 for the functional circuit. When a voltage signal or pulse at pin 12 equals or exceeds a trigger voltage of circuit 10, as set by breakdown voltage Vz of zener diode 22, SCR 30 is triggered (or latched on). After SCR 30 is triggered, it behaves as a low resistive device and allows the high voltage at pin 12 to divide across $R_{PIN}$ 13, and the combined resistance of the anode-cathode resistance of the SCR, and $Rs_1$ 19 and $Rs_2$ 20, to ground voltage reference terminal 24. In other words, the SCR in circuit 10 quickly clamps the high voltage to prevent damage to the circuitry of the functional circuit. This thereby provides means for enabling the voltage at pin 12 to conduct along a path from the pin through the SCR to ground in response to a voltage condition at the pin at or above a trigger voltage.

The high voltage signal and its power dissipates substantially over $R_{PIN}$ 13 until the voltage across $R_{PIN}$ falls below a hold voltage level. The hold voltage level is defined as the voltage across $R_{PIN}$ 13 resulting in a voltage across the $Rs_1$ 19 which provides a minimum holding current to the SCR anode-gate to maintaining the SCR latched state. After triggering, SCR 30 is held on by PNP transistor 16, which includes the anode, anode-gate, and cathode-gate of SCR 30, by the current to the base (anode-gate of SCR 30) of the PNP transistor. The relative sizes (resistance values) of $R_{PIN}$ and $Rs_1$ are chosen so that the voltage drop across $Rs_1$ will fall below the $V_{BE}$ of PNP transistor 16 when the voltage across $R_{PIN}$ drops below the hold voltage level, e.g. 35 volts where $V_z$=50 volts. When the voltage across $R_{PIN}$ drops below the hold voltage level, the voltage across $Rs_1$ falls below the $V_{BE}$ of PNP transistor 16, causing the current to the anode-gate to drop below the holding current needed to keep SCR 30, thereby turning off the SCR. The size of $Rs_2$ is set higher than $Rs_1$ such that the holding current is controlled at the anode-gate, e.g., $Rs_1$=1K ohm, and $Rs_2$=10K ohm. Thus, the holding current to SCR 30 is controlled to its anode-gate by the relative values of $R_{PIN}$ and $Rs_1$.

The hold voltage level is independent of the trigger voltage level, and is set below the trigger voltage. Accordingly, the value of the hold voltage level over $R_{PIN}$ may be set by adjusting the relative resistance values of $R_{PIN}$ and $Rs_1$ such that after the SCR is triggered, the SCR automatically turns off once the voltage signal at pin 12 has returned near, at, or within a predefined operational voltage range for the functional circuit, i.e., the ESD voltage is no longer present at pin 12. Thus, the SCR turn off after being triggered without requiring either the removal of the input signal to pin 12 or the power to the functional circuit.

Also, the value of the resistance of $R_{PIN}$ 13 is greater than that of $Rs_1$ 19 and $Rs_2$ 20, such that after the SCR triggers, the power of the high voltage $(V_{LOAD})$ dissipates over $R_{PIN}$ 13 by the equation Power=$V_{LOAD}^2/R_{PIN}$. This protects the functional circuit from the power of the high voltage pulse which would otherwise damage the functional circuit, as well as other elements of circuit 10.

By using zener diode 22, circuit 10 has means for setting the breakdown voltage (the trigger voltage of circuit 10) of SCR 30 between its anode-gate and cathode-gate terminals. In the alternative to zener diode 22, this means may be internal to SCR 30 by using the reverse breakdown voltage of the anode-gate/cathode-gate junction of the SCR, which when exceeded triggers the SCR. The anode-gate/cathode-gate junction breakdown voltage can thus be considered an internal fixed voltage trigger device which may be set by the SCR construction. In SCR 30, this internal means would be represented by the breakdown voltage of the collector-base junctions of transistors 16 and 17. However, the use of zener diode 22 is preferred because it can provide a lower and more controllable trigger voltage. Consequently, the zener diode breakdown voltage is set lower than the anode-gate/cathode-gate junction breakdown voltage to assure that the zener diode will breakdown first.

As stated above, the holding current for the SCR 30 at PNP transistor 16 is established by $R_{PIN}$ and $Rs_1$. Once SCR 30 triggers, $R_{PIN}$ and $Rs_1$ may be considered part of a voltage divider circuit. To hold the SCR on, the mount of input voltage $(V_e)$ at pin 12 dropped across $Rs_1$ $(V_1)$ should exceed the $V_{BE}$ of the PNP transistor (the anode/anode-gate junction). That relationship is as follows:

$$V_1 \geq V_{BE} \geq V_e \left( \frac{Rs_1}{R_{PIN} + Rs_1} \right)$$

When the voltage across $Rs_1$ drops below $V_1$, the anode/anode-gate junction becomes reverse biased and the SCR unlatches. The values of $R_{PIN}$ and $Rs_1$ are chosen so that $V_1$ will be small enough to turn off the anode/anode-gate junction of SCR 30 when the voltage across $R_{PIN}$ falls below the hold voltage level. Note that since $R_{PIN}$ is substantially the largest resistance appearing to $V_e$, then the voltage across $R_{PIN}$ will be about $V_e$.

In circuit 10, the relative size of the $R_{PIN}$ 13 and the one of shunt resisters $Rs_1$ 19 or $Rs_2$ 20 having the lowest resistance controls the holding current of SCR 30 at either the anode-gate or cathode-gate of the SCR. It should also be noted that the resistance value of shunt resistors $Rs_1$ 19 and $Rs_2$ 20 in circuit 10 may be represent all, or in part, by the internal resistance of the SCR which lies in series with the resistors, such as their respective gates.

An example of circuit 10 will now be described, where (1) the functional circuit is protected from ESD voltages higher than 40 V, (2) the normal operation range of the device is below 20 volts, and (3) the holding current at either the anode-gate or cathode gate terminals is 10 mA. In this example the following component values may be used: Vz is set to 40 V, pin resistor $R_{PIN}$ is set to 2 Kohms, and shunt resistors $Rs_1$ and $Rs_2$ are both set to 70 ohms. In operation, when a high voltage signal at or greater than 40 V appears at pin 12, zener diode 22 breaks down and the SCR triggers. Note that after the SCR triggers, it acts like a low voltage device (e.g., 1 V) allowing substantially all of the voltage and incident power of the high voltage signal to dissipate over the pin resistor. Once latched, the SCR will remain latched until the voltage across pin resistor falls below 20 V, the hold voltage, at that point the SCR automatically unlatches because the voltage across shunt resistors $Rs_1$ falls below 0.7 V (the $V_{BE}$ of the PNP transistor), resulting in less than the minimum 10 mA holding current needed to keep the SCR latched at its anode-gate.

The above discussion describes circuit 10 in which the holding current to the anode-gate of SCR 30 is controlled by $Rs_1$ in combination with $R_{PIN}$. However, circuit 10 may alternatively control the holding current to the cathode-gate of SCR 30 by $Rs_2$ in combination with $R_{PIN}$. In this case, the value of $Rs_2$ resistance is lower than that of $Rs_1$ such that after triggering of SCR 30, it is held on by NPN transistor 17 including cathode, cathode-gate, and anode-gate. The size of $R_{PIN}$ and $Rs_2$ are chosen so that the voltage drop across $Rs_2$ will fall below the $V_{BE}$ of NPN transistor 17 when the voltage across $R_{PIN}$ drops below to the hold voltage. When the voltage across $R_{PIN}$ drops below the hold voltage level, the voltage across $Rs_2$ fails below the $V_{BE}$ of NPN transistor 17, causing the current to the cathode-gate to drop below the holding current needed to keep SCR 30, thereby mining off the SCR. The selection of the gate, anode-gate or cathode-gate, to control the holding current of the SCR depends on circuit design preference and SCR construction.

Figure 3A:
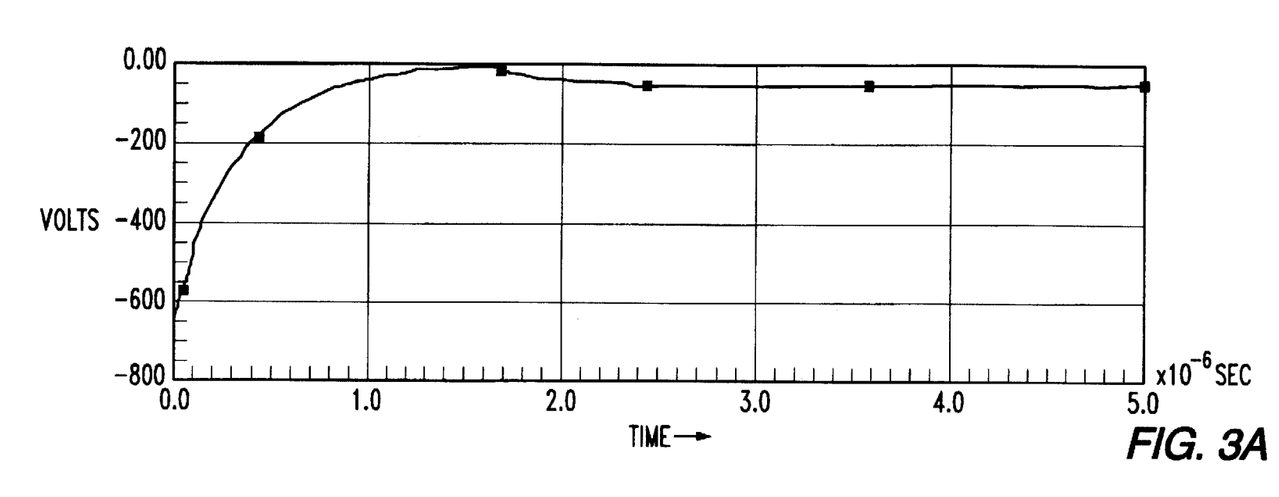
FIGS. 3A and 3B are graphs showing simulated operation of the protection circuit of FIG. 2 where the circuit is oriented for protecting a device from negative polarity high voltages.
Figure 3B:
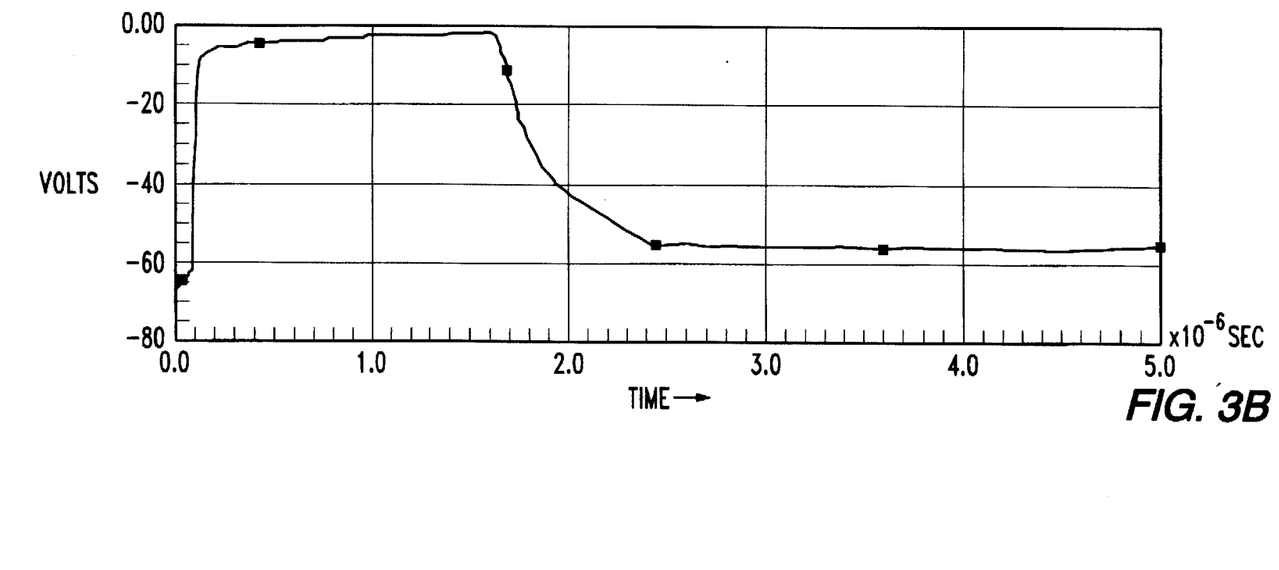

The operation of circuit 10 is shown in the graphical simulations of FIGS. 3A and 3B, in which the circuit is oriented to protect a functional circuit from negative polarity voltages greater than 60 V with a hold voltage of 20 V. The pin resistor is set to 500 ohms and the shunt resistors are each 10 ohms. A 4 KV human body model ESD pulse is applied to the pin with a 1.5 Kohms source. FIG. 3A represents the voltage at pin 12 where at time zero an ESD voltage is simulated. FIG. 3B represents the voltage at the input to functional circuit 14. As shown in FIG. 3B, initially 600 V at the pin is suppressed to about 70 volts by the circuit, and the SCR triggers within about 100 nanoseconds to place the input to functional circuit 14 at almost zero volts (about 5 V). When the voltage at the pin has decayed to about 20 V (at about time equal to 1.7 microseconds), the SCR unlatches and automatically turns off.

Figure 4:
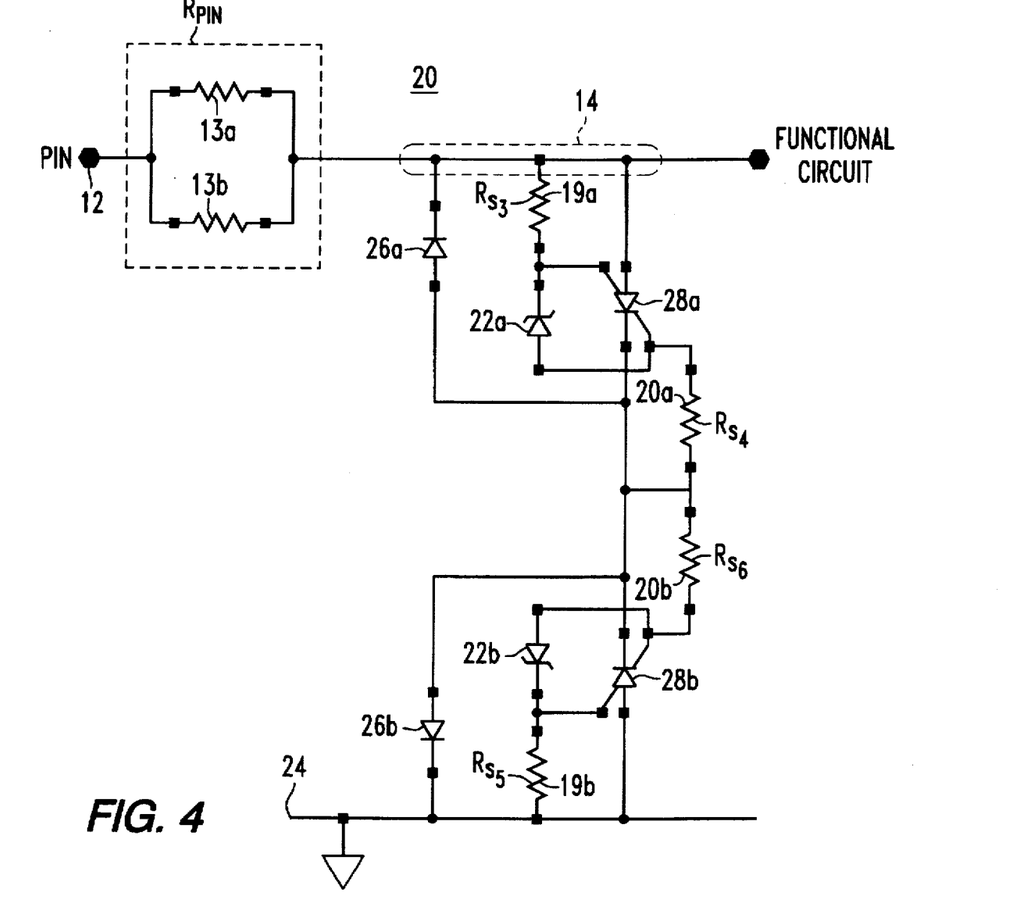
FIG. 4 is a schematic diagram of the protection circuit for protecting a functional circuit from both positive and negative polarity high voltages.

Referring to FIG. 4, a schematic diagram of a circuit 20 of the present invention is shown for protecting a functional circuit from both positive and negative polarity high voltages, such as caused by ESD. As with circuit 10, circuit 20 has an external pin 12 connected in series with pin resistor $R_{PIN}$, which is formed by two parallel resistors 13a and 13b, and input terminal 14 of the functional circuit. Between input terminal 14 and a ground voltage reference terminal 24 are two series SCRs 28a and 28b in a back-to-back configuration, i.e., their cathode terminals are electrically connected together. The anode terminal of SCR 28a is connected to terminal 14, while the anode terminal of SCR 28b is connected to a ground voltage reference terminal 24. Shunt resistors 19a ($Rs_3$) and 19b ($Rs_5$) are connected to SCRs 28a and 28b, respectively, similar to shunt resistor 19 in circuit 10 with respect to the SCR formed by transistors 16 and 17. Shunt resistors 20a ($Rs_4$) and 20b ($Rs_6$) are also connected to SCRs 28a and 28b, respectively, similar to shunt resistor 20 in circuit 10 with respect to the SCR formed by transistors 16 and 17. Also, zener diodes 22a and 22b provide a triggering means for SCRs 28a and 28b, respectively, similar to zener diode 22 in circuit 10 with respect to the SCR formed by transistors 16 and 17.

To provide bidirectional or bipolarity protection, SCR 28a protects against positive polarity voltages at or exceeding the positive trigger voltage set by zener diode 22a breakdown voltage, while SCR 28b protects against negative polarity voltages at or exceeding the negative trigger voltage set by zener diode 22b breakdown voltage. The operation of circuit 20 is the same as that of circuit 10 when oriented to protect for positive or negative high voltages, since circuit 20 provides two bypass diodes 26a and 26b. Diode 26a is connected with its anode end to functional circuit input terminal 14 and its cathode end to the anode terminal of SCR 28a. Diode 28b is connected with its anode end to ground voltage reference terminal 24 and its cathode end to the anode terminal of SCR 28b. These diodes bypass and protect the non-triggering SCR when the other SCR has been triggered. For example, if a negative polarity voltage ESD appears a pin 12 that is greater than the trigger voltage of SCR 28b, SCR 28b triggers and a conduction path is provided from ground voltage reference terminal 24 through SCR 28b and diode 26a to pin 12.

As in circuit 10, the relative size of the $R_{PIN}$ 13 in circuit 20 and the shunt resistor of SCR 28a and 28b having the lowest resistance controls the holding current of SCR 30. It should also be noted that the resistance value of shunt resistors $Rs_3$ 19a, $Rs_4$ 20a, $Rs_5$ 19b, and $Rs_6$ 20b may represent all, or in part, by the internal resistance of the SCR which lies in series with the resistors, such as their respective gates.

Figure 5:
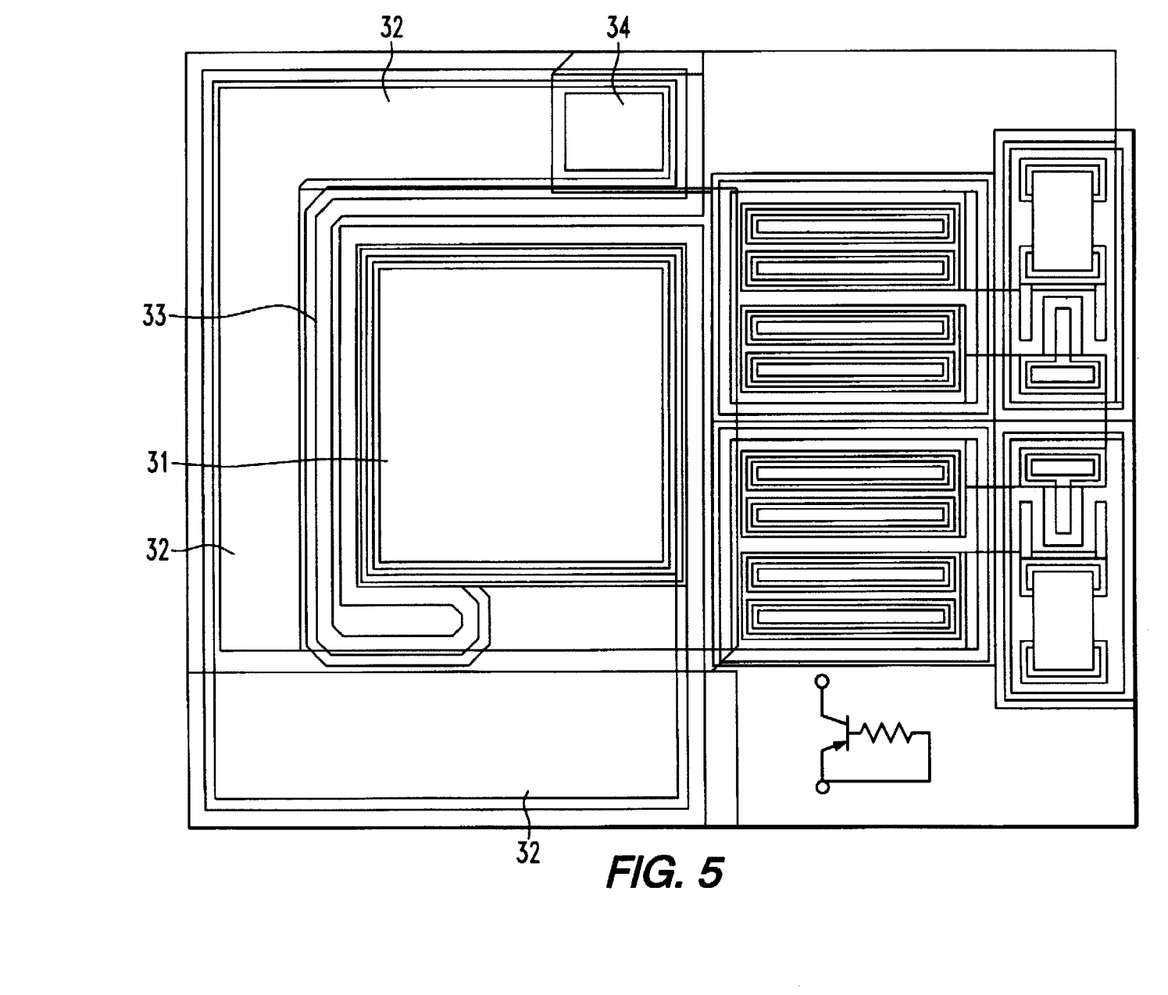
FIG. 5 is a plan view of an integrated circuit in accordance with the schematic diagram of FIG. 4.

Referring to FIG. 5, a diagram of an integrated circuit of circuit 20 is shown. In this diagram, pad/contact 31 connects to pin 12. A "C shaped" region 32 connects at one end to pad/contact 31 and at its other end to inner contact 34. Region 33 may be of undoped polysilicon to isolate region 32 from pad/contact 31. Region 32 represents pin resistor 13, while contact 34 is heavily doped and is electrically connected to input terminal 14. Region 32 is formed in the integrated circuit, such that it extends from pad/contact 31 to contact 34 and provides low dopant levels near the pad and relatively higher dopant levels (e.g., $N^{++}$) as region 32 extends to input terminal 14. Thus, the region 32 is more resistive to current flow near pad/contact 31 relative to contact 34, which better isolates the power that dissipates over the pin resistor during a high voltage condition at pin 12 from the rest of the circuit, especially SCRs 28a and 28b.

Further, by preventing the power dissipation of the ESD voltage from the SCRs, the SCRs can be made more compact in the integrated circuit.

Figure 6:
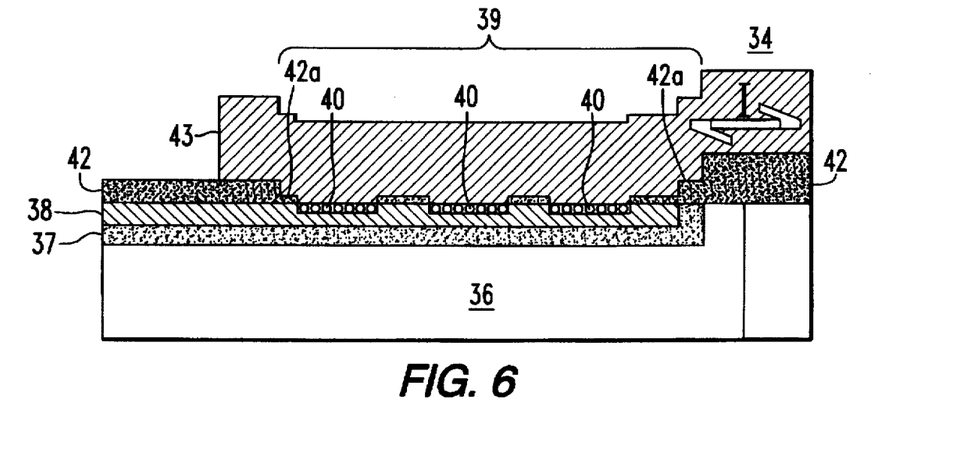
FIG. 6 is a cross-section and internal contact of the integrated circuit of FIG. 5.

Contact 34 may be an N+ type contact, as shown in FIG. 6. Contact 34 is formed on a substrate 36 of the integrated circuit. In substrate 36 is a N doped layer 37, and then a N+ doped layer 38. An oxide layer 42 is patterned with a stair-case structure 42a about an opening 39. Circular apertures 40 are provided in layer 42, and metal layer 43 makes a connection to layer 38 through these apertures 40. Preferably, there are five circular apertures 40 each with a periphery as large as possible within opening 39. These apertures 40 form a plurality of contact regions rather than a single contact region to reduce the level of current flowing through contact 34 to elements between functional circuit input terminal 14 and ground 24 of the circuit. In addition, metal layer 43 also forms over layer 42 and its stair-case structure 42a. This stair-case structure 42a is provided to improve the coverage of metal layer 43 over layer 42, and may prevent possible weak points (resistances) in contact 34.

Figure 7:
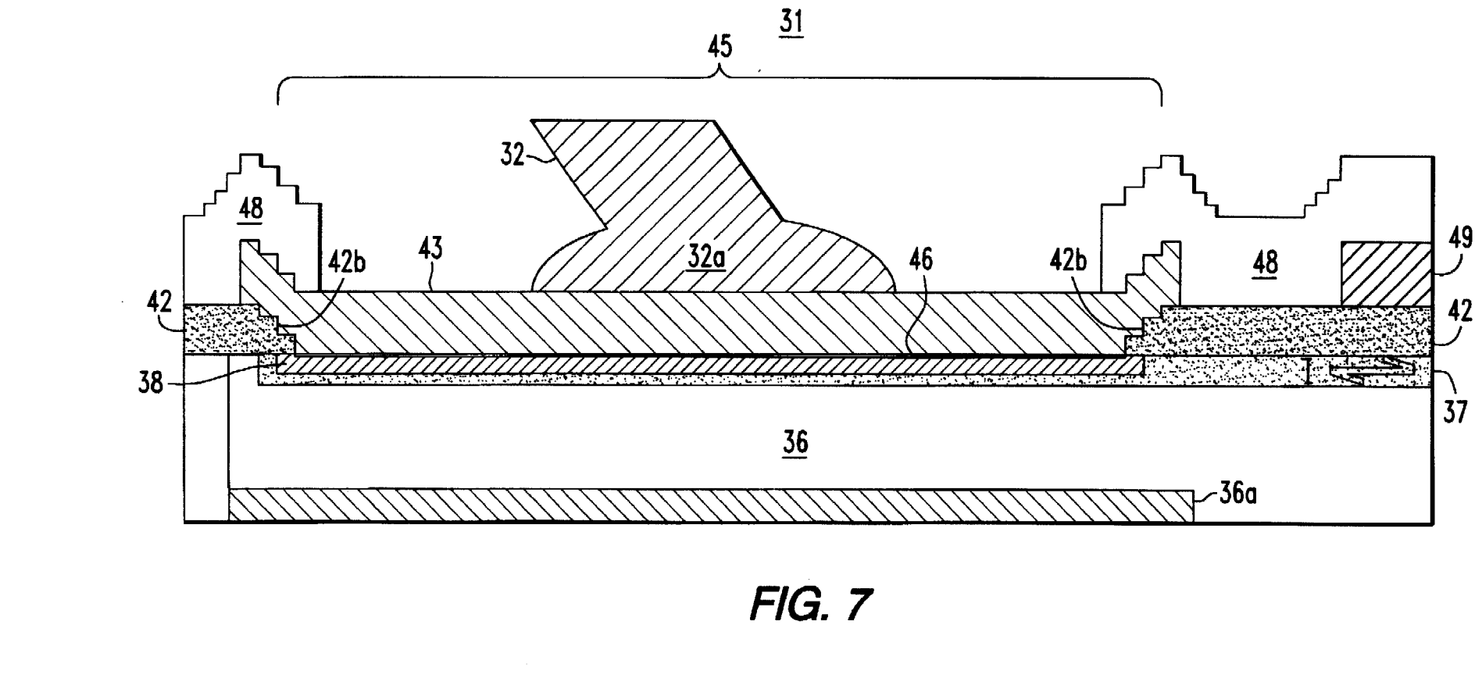
FIG. 7 is a cross-section of a pad/contact of the integrated circuit of FIG. 5.

Further, pad/contact 31 of FIG. 5 is shown in greater detail in FIG. 7. A bond wire 32 is connected to an external pin (not shown) and to pad 31 at ball 32a. The layers and substrate of FIG. 6 are also shown in FIG. 7 with respect to opening 45, except only a single aperture 46 is formed through oxide layer 42 through which metal layer 43 makes connection to N+ layer 38. Also, similar to contact 34 of FIG. 6, oxide layer 42 of pad/contact 31 his a stair-case like structure 42b to improve the coverage of the metal layer 43 over layer 42. The pad/contact 31 further provides a silicon oxide layer 48, a ground reference contact 49 (used elsewhere in the circuit), and a lower N+ layer 36a in substrate 36. N+ layer 36a is an optional heavily doped layer which may be used to further lower the resistance of pad/contact 31. Note that pad/contact 31 and contact 34 represent the two ends of the pin resistor.

In addition to other features of circuits 10 and 20 discussed above, another feature of these circuits is that they provide high voltage protection of their associated functional circuit independent of whether the functional circuit is powered or unpowered. This is because these circuits 10 and 20 do not require a power supply for circuit operation from either the functional circuit or another source. This is a benefit in providing high voltage protection of the functional circuit throughout the manufacture and test of the applications which incorporate IC packages containing functional circuit is protected by circuits 10 or 20. Furthermore, in some applications redundant functional circuits may be attached to pin 12. Each redundant functional circuit has its own protection circuit 10 or 20. These redundant circuits are usually unpowered and can inadvertently turn on by input signals at pin 12. In these applications, circuit 10 and 20 can protect such redundant circuits from both ESD as well as from input signals which may turn them on.

From the foregoing description, it will be apparent that there has been provided improved high voltage protection circuits. Variations and modification in the herein described circuit, in accordance with the invention, will undoubtedly suggest themselves to those skilled in the art. Accordingly, the foregoing description should be taken as illustrative and not in a limiting sense.

I claim:

1. An integrated circuit having a functional circuit and a high voltage protection circuit disposed between an input/output pin and the functional circuit comprising:

a voltage reference terminal;

a first resistor connected in series with said pin and the functional circuit;

an SCR having an anode terminal, a cathode terminal, an anode-gate terminal, and cathode gate terminal, wherein said anode terminal is connected to said functional circuit, and said cathode terminal is connected to said voltage reference terminal; and a first resistive means across said anode terminal and said anode-gate terminal.

2. The integrated circuit of claim 1 wherein said first resistive means is a second resistor.

3. The integrated circuit of claim 1 wherein the SCR has a holding current set by the relative resistance values of the first resistor and the first resistive means.

4. The integrated circuit of claim 1 further comprises a second resistive means across said cathode terminal and said cathode gate terminal.

5. The integrated circuit of claim 4 wherein said first resistive means has a lower resistance value than said second resistive means, and said SCR has a holding current to the anode-gate terminal set by the relative resistance values of the first resistor and the first resistive means.

6. The integrated circuit of claim 4 wherein said second resistive means has a lower resistance value than said first resistive means, and said SCR has a holding current to the cathode-gate terminal set by the relative resistance values of the first resistor and the second resistive means.

7. The integrated circuit of claim 1 further comprising means for setting a breakdown voltage between said anode-gate terminal and said cathode-gate terminal.

8. The integrated circuit according to claim 7 wherein said means comprises a zener diode having an anode end and a cathode end, wherein said anode end is connected to said anode-gate terminal and said cathode end is connected to said cathode-gate terminal.

9. The integrated circuit according to claim 7 wherein:

said device has a predetermined operating voltage range at said pin;

said circuit has a trigger voltage level substantially equal to said breakdown voltage, and said trigger voltage level is beyond said operating voltage range;

means responsive to said setting means for enabling conduction along a path through said SCR and said first resistor between said pin and said voltage reference terminal when a signal at said pin exceeds or equals said trigger voltage level; and means for disabling conduction along said path when said voltage across said first resistor becomes lower than a predetermined hold voltage level.

10. The integrated circuit according to claim 9 wherein said enabling means further comprises means for substantially dissipating the power of the signal along said path across said first resistor.

11. The integrated circuit according to claim 1 wherein said circuit is formed on a substrate, said circuit further comprising:

a pad on said substrate connected to said pin; and said first resistor being connected to said pad and defining a region in said substrate extending from said pad to the functional circuit, said region having lower dopant levels near said pad and relatively higher dopant levels as said region extends to the functional circuit.

12. The integrated circuit according to claim 1 wherein said voltage reference terminal is at or near ground.

13. An integrated circuit for protecting a functional circuit from high voltage signals caused by electrostatic discharge at an external pin of the device comprising:

a voltage reference terminal;

a first resistor connected in series with said pin and the functional circuit;

a first SCR and a second SCR, said first and second SCRs each having an anode terminal, a cathode terminal, an anode-gate terminal, and cathode-gate terminal, wherein said anode terminal of said first SCR is connected to the functional circuit, said cathode terminal of said first SCR is connected to said cathode terminal of said second SCR, and said anode terminal of said second SCR is connected to said voltage refer terminal;

a second resistor and a third resistor, said second and third resistors being connected across said anode terminal and said anode-gate terminal of said first and second SCRs, respectively;

a fourth resistor and a fifth resistor, said fourth and fifth resistors being connected across said cathode terminal and said cathode-gate terminal of said first and second SCRs, respectively; and means for setting a breakdown voltage between said anode-gate terminal and said cathode-gate terminal for each of said first and said second SCRs.

14. The integrated circuit of claim 13 wherein the first SCR has a holding current set by the relative resistance values of the first resistor and one of said second and fourth resistors and said second SCR has a holding current set by the relative values of said first resistor and one of said third and fifth resistors.

15. The integrated circuit according to claim 13 wherein said means for setting a breakdown voltage comprises two zener diodes each having an anode end and a cathode end, wherein said anode end of said first and second diodes is connected to said anode-gate terminal of said first and second SCRs, respectively, and said cathode end of said first and second diodes is connected to said cathode-gate terminal of said first and second SCRs, respectively.

16. The integrated circuit according to claim 13 wherein:

said device has a predetermined operating voltage range at said pin;

said first SCR has a positive trigger voltage level substantially equal to said breakdown voltage of said first SCR, and said second SCR has a negative trigger voltage level substantially equal to said breakdown voltage of said second SCR, and said positive and negative trigger voltage levels are beyond said operating voltage range;

means responsive to said setting means for enabling conduction along a first path through said first SCR and said first resistor between said pin and said voltage reference terminal when a signal at said pin is greater than or equal to said positive trigger voltage level;

means responsive to said setting means for enabling conduction along a second path through said second SCR and said first resistor between said voltage reference terminal and said pin when a signal at said pin is lower than or equal to said negative trigger voltage level; and means for disabling conduction along said first and second paths when said signal at said first resistor becomes lower than a predetermined positive hold voltage level and greater than a predetermined negative hold voltage level, respectively.

17. The integrated circuit according to claim 16 wherein:

said means for enabling conduction along said first path further comprises a bypass diode across said anode and cathode terminals of said second SCR;

said means for enabling conduction along said second path further comprises another bypass diode across said anode and cathode terminals of said first SCR.

18. The integrated circuit according to claim 16 wherein said disabling means further comprises means for substantially dissipating the power of the signal along one of said first and second paths across said first resistor.

19. The integrated circuit according to claim 13 wherein said integrated circuit is formed on a substrate, said integrated circuit further comprising:

a pad on said substrate connected to said pin; and said first resistor being connected to said pad and defining a region in said substrate extending from said pad to said functional circuit input, said region having lower dopant levels near said pad and relatively higher dopant levels as said region extends to said functional circuit input.

20. An integrated circuit for protecting a functional semiconductor device from electrostatic discharges at an external pin of the device comprising:

a voltage reference terminal;

at least one resistor connected in series with said pin and an input of said device;

at least one SCR coupled between said input and said voltage reference terminal, each said SCR having at least one gate, and a holding current level to said gate at which said SCR stays in a latched state once triggered;

means for setting a hold voltage level across said resistor to enable each said SCR to enter an unlatch state, and for decreasing the current on the gate of the SCR below the holding current level; and means for setting the triggering voltage level for each said SCR to enable the SCR to enter a latched state when a voltage signal at the gate of the SCR increases above the trigger voltage level.

21. The integrated circuit according to claim 20 wherein said resistor has a sufficient resistance value to enable substantially all of a voltage signal at said external pin to dissipate across said resistor when said SCR enters said latched state.

* * * * *